United States Patent [19]

Taffe et al.

[11] Patent Number: 5,467,029

[45] Date of Patent: Nov. 14, 1995

[54] OR ARRAY ARCHITECTURE FOR A PROGRAMMABLE LOGIC DEVICE

[75] Inventors: Norman P. Taffe, San Jose; Stephen M. Douglass, Saratoga; Hagop Nazarian, San Jose, all of Calif.

[73] Assignee: Cypress Semiconductor Corp., San Jose, Calif.

[21] Appl. No.: 144,663

[22] Filed: Oct. 28, 1993

[51] Int. Cl.$^6$ .................................................. H03K 19/173
[52] U.S. Cl. .................................................. 326/41; 326/39
[58] Field of Search .................................. 307/465–469; 326/39, 41

[56] References Cited

U.S. PATENT DOCUMENTS

| | | | |
|---|---|---|---|
| 4,554,640 | 11/1985 | Wong | 307/465 |
| 4,644,191 | 2/1987 | Fisher | 307/465 |
| 4,758,746 | 7/1988 | Birkner | 326/38 |
| 4,878,200 | 10/1989 | Asghar et al. | 365/189.02 |
| 5,189,320 | 2/1993 | Gongwer | 307/465 |
| 5,220,214 | 6/1993 | Pederson | 307/469 |
| 5,235,221 | 8/1993 | Douglas | 307/465 |
| 5,309,046 | 5/1994 | Steele | 307/465 |
| 5,332,929 | 7/1994 | Chiang | 307/465 |

OTHER PUBLICATIONS

FLASH370 PLD Family, Preliminary Data, Cypress Semiconductor, May 1993, pp. 1–7.

*Primary Examiner*—Edward P. Westin
*Assistant Examiner*—Andrew Sanders
*Attorney, Agent, or Firm*—Blakely, Sokoloff, Taylor & Zafman

[57] ABSTRACT

An OR array including a first multiplicity of OR devices, to which a second multiplicity of product term signals are variably distributed. Some product term signals are distributed to four OR devices, other product term signals are distributed two or three OR devices, and still other product term signals are distributed to only one OR device.

24 Claims, 3 Drawing Sheets

OR ARRAY ARCHITECTURE FOR A PROGRAMMABLE LOGIC DEVICE

FIELD OF THE INVENTION

The present invention relates to programmable logic devices. More particularly, the present invention relates to the architecture of an OR array within a programmable logic device.

BACKGROUND OF THE INVENTION

Programmable logic devices are popular general purpose logic devices. PLDs generally include an AND array that generates a large number of product term signals, which are input to an OR array. Within one type of PLD, a programmable logic array (PLA), both the AND array and the OR array are fully programmable. This means that every input to an array is distributed to every device within the array. The programmability of both arrays gives PLAs their design flexibility and contributes to their relative slowness. PLAs are relatively slow because two arrays must be sensed before an output signal is valid.

Programmable array logic devices (PALs) are also programmable logic devices and include an AND array and an OR array. PALs use fixed OR arrays to achieve a speed advantage as compared to PLAs. Within a fixed OR array every product term signal is not distributed to every OR device. Further, each product term signal is distributed to only one OR device within the OR array. This distribution scheme prevents both product term signal sharing and steering. Thus, PALs achieve their speed advantage as compared to PLAs by surrendering some design flexibility. This lack of flexibility leads to underutilization of PAL resources. For example, in a PAL including 125 product term signals, it is not uncommon for a design to use only 40 product term signals. Underutilization of PAL resources becomes problematical as PAL complexity increases while PAL size constraints remain the same. As a result, there is demand for a device that has the speed advantages of a PAL yet offers the flexibility of a PLA.

Advanced Micro Devices attempted to meet this demand with its MACH family of devices. These devices include a programmable AND array and a fixed OR array. MACH devices include multiplexors, called logic allocators, coupled between the AND array and the OR array. Logic allocators allow steering of small groups of product term signals between OR devices in return for a small speed penalty. Thus, MACH devices do not permit product term signal steering with a granularity of one.

Altera also attempted to meet the demand for fast and flexible PLDs with its MAX family of devices. Max devices include shared expanders which allow product term signal sharing within a fixed OR array. Shared expanders feed the output of one OR device to the input of another OR device. Note that Max devices do not allow product term signal sharing with a granularity of one.

Additionally, shared expanders provide increased flexibility at the expense of a small speed penalty.

SUMMARY OF THE INVENTION

It is an object of the present invention to provide an OR army that allows product term signal sharing.

It is an object of the present invention to allow product term signal sharing with a granularity of one.

It is another object of the present invention to provide an OR array that allows product term signal steering.

It is still a further object of the present invention to allow product term signal steering with a granularity of one.

It is a still further object of the present invention to provide an OR array that offers the flexibility of a programmable OR array.

It is yet another object of the present invention to provide an OR array that provides nearly the speed of a fixed array.

It a still further object of the present invention to provide an OR array that allows product term signal steering and sharing with a negligible speed penalty.

These and other objects are met by the OR array of the present invention. The OR array includes a first multiplicity of OR devices, to which a second multiplicity of product term signals are variably distributed. Some product term signals are distributed to four OR devices, other product term signals are distributed two or three OR devices, and still other product term signals are distributed to only one OR device.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which.

DETAILED DESCRIPTION

Figure 1:
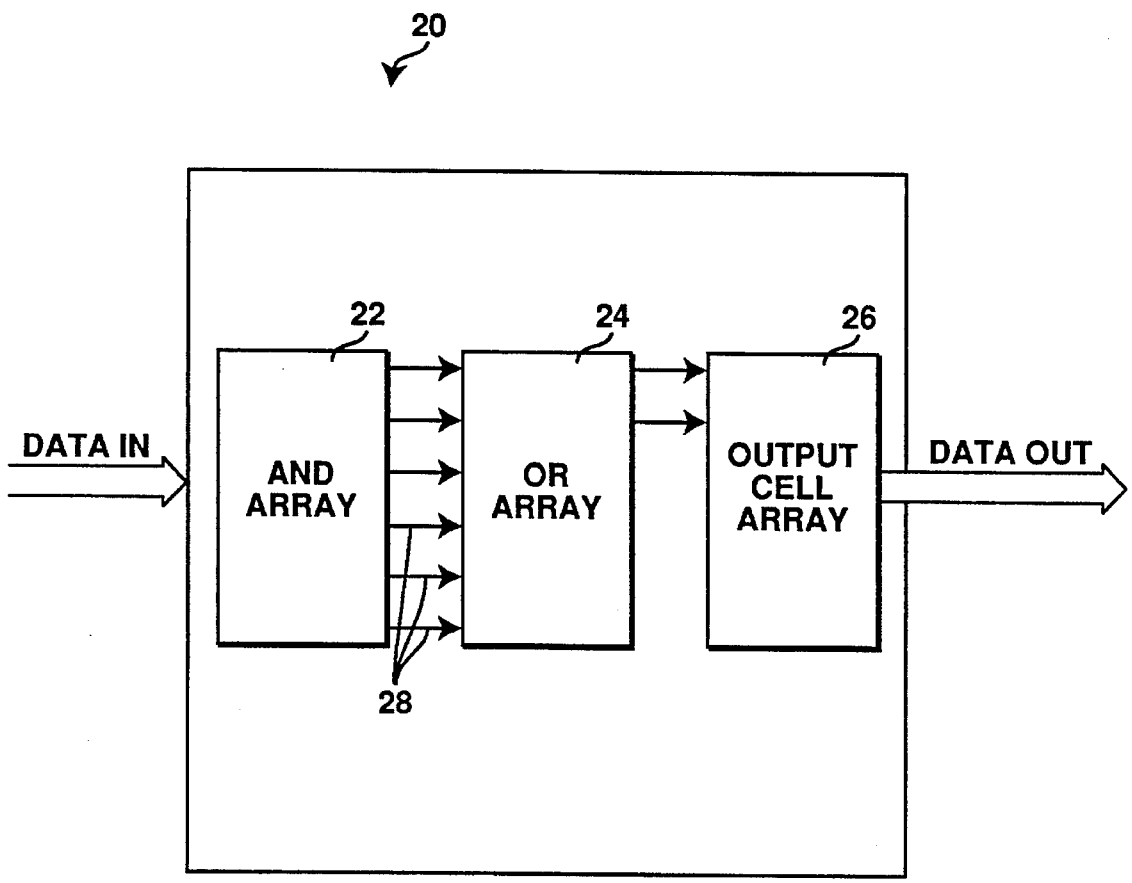
FIG. 1 is a block diagram of a programmable logic device.

FIG. 1 illustrates in block diagram form a programmable logic device (PLD) 20 fabricated on a single semiconductor substrate. PLD 20 includes AND array 22, OR array 24 and output cell array 26. PLD 20 implements a "sum of the products" logic. Programmable AND array 22 is coupled to OR array 24. As will be described in more detail later, OR array 24 variably distributes product term signals generated by AND array 22 to OR devices within array 24. As a result, OR array 24 provides the flexibility of a programmable OR array while approximating the speed performance of a fixed OR array.

OR array 24 may be used with other circuits, such as a programmable interconnect matrix (PIM) or logic arrays, as will be obvious to one of ordinary skill in the art. It will also be obvious to one of ordinary skill that OR array can be used within devices including input cell arrays, which condition input signals.

As its name implies, AND array 22 is a large array of multiple input AND devices. Each signal input to array 22 can be input to every AND device, thus AND array 22 is referred to as "fully programmable." AND array 22 generates a great many output signals from the data input to it. In one embodiment, AND array 22 outputs 80 signals.

Signals output by AND array 22 are commonly referred to as "product terms" 28. Because "product term" also refers to the circuitry that generates a product term, the phrases "product term signal" or "signal" will be used to distinguish the signal from the circuitry that generates it. Product term signals 28 are digital signals. In other words, product term signals 28 generally assume two different voltage levels. One voltage level is representative of a logic 1 while the other voltage level is representative of a logic 0.

Product term signals 28 are coupled as inputs to OR array 24. As implied by its name, OR array 24 generates a number of output signals by ORing selected product term signals 28 together. The outputs from OR array 24 are coupled to output cell array 26.

OR array 24 is not fully programmable, thus not every product term signal is distributed to every OR device within OR array 24. Even though it is not fully programmable, the architecture of OR array 24 allows product term signal sharing and product term signal steering with a granularity of one. As a result, OR array 24 provides flexibility in product term signal allocation while maintaining the speed advantage of traditional PALs.

Figure 2:
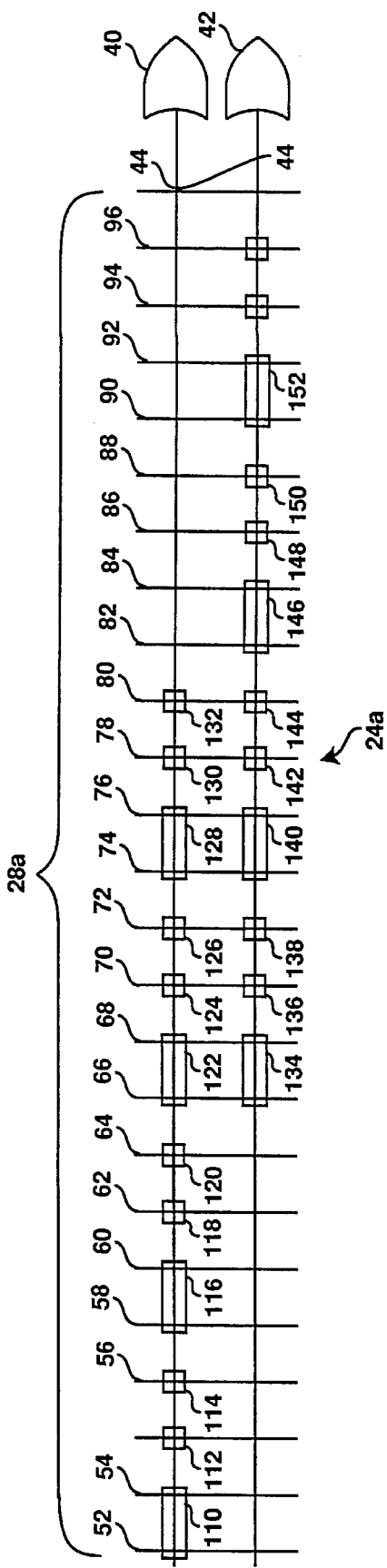
FIG. 2 is a block diagram of a portion of an OR array.

FIG. 2 illustrates schematically portion 24a of OR array 24. Portion 24a illustrates two OR devices 40 and 42 of the total number included within OR array 24 and a subset 28a of the total number of product term signals 28 input to OR array 26.

FIG. 2 utilizes conventions common to the depiction of PLDs. All signals input to a single OR device are represented by a single line. Thus, while the input side of OR device 40 is sixteen bits wide, all sixteen inputs are indicated using a single line, line 44. Line 44 intersects all of the illustrated product term signal lines 28a; however, this does not mean that all product term signals 28a are distributed to OR device 40. Only those product term signals 52–80 coupled to line 44 by a programmable element 110–132 are distributed to OR device 40. Similarly, only product term signals 66–96 are distributed to OR device 42 because these are the only signals coupled to a programmable element and OR device 42. As used herein, "programmable element" includes programmable memory cells, fuses, SRAM cells and any structure that can be programmed or set after manufacture to couple/uncouple an OR device to a product term signal.

Whether or not product term signals distributed to an OR device are input, or coupled to, that OR device depends upon whether its associated programmable elements are programmed. Programmed programmable elements couple their associated product term signals to their associated OR device. However, whether programming couples or uncouples a product term function signal from an OR device is not important to realizing OR array 24. In FIG. 2, programmable elements are preferably realized using programmable memory cells. Programming of a programmable memory cell alters its threshold voltage such that conduction occurs within the programmable cell. Thus, programming of a programmable cell "connects" its associated product term signal to the OR device. Thus, programming programmable cells is similar to blowing fuses in bipolar CMOS devices. In one embodiment, the programmable cells are flash memory cells and can be reprogrammed. Programming and reprogramming of the programmable cells is done by an external user.

Some programmable elements within OR array 24 distribute two product term signals to an OR device. Programming of such a programmable element disconnects both product term signals from the OR device.

The distribution of product term signals within OR array 24 permits product term steering. Product term steering refers to steering of product term signals to OR devices as needed. Any number of product term signals can be steered to an individual OR device. To illustrate, assume that OR device 40 uses only four of the product term signals distributed to it. In other words, after programming, OR device 40 is coupled to only 4 product term signals. Product term signals unused by OR device 40 can be steered to, or used by, neighboring OR device 42. This is because product term signals 66–80 are distributed via programmable elements to both OR device 42 and OR device 40. Steering of product term signals increases the effective density of the PLD without increasing PLD die size.

OR array 24 provides product term steering with a granularity of one. This is because some programmable elements couple a single product term signal to OR device 42. The total size of OR array 24 is minimized by distributing two product term signals to an OR device via a single programmable element, which is no larger than a programmable element that is coupled to only one product term signal. For example, programmable element 134 distributes both product term signals 66 and 68 to OR device 42.

Product term sharing also increases the effective density of PLD 20 without increasing its die size. Product term signal sharing means that one product term signal may be used by multiple OR devices. For example, assume that memory cells 110–132 couple all sixteen available product term signals 52–80 to OR device 40. Product term signals 66–80 may be shared with OR device 42 by leaving programmable elements 134–144 in their unprogrammed state.

OR array 24a is not fully programmable. In other words, not every product term signal is distributed to every OR device within OR array 24a. For example, product term signals 52–64 are distributed to OR device 40 but not to OR device 42. Similarly, product term signals 82–96 are distributed to OR device 42 but not to OR device 40. OR array 24a operates more quickly than a PLA because it is not fully programmable, yet offers much the same flexibility in product term signal allocation as a PLA via variable product term signal distribution that permits product term sharing and product term steering.

Figure 3:
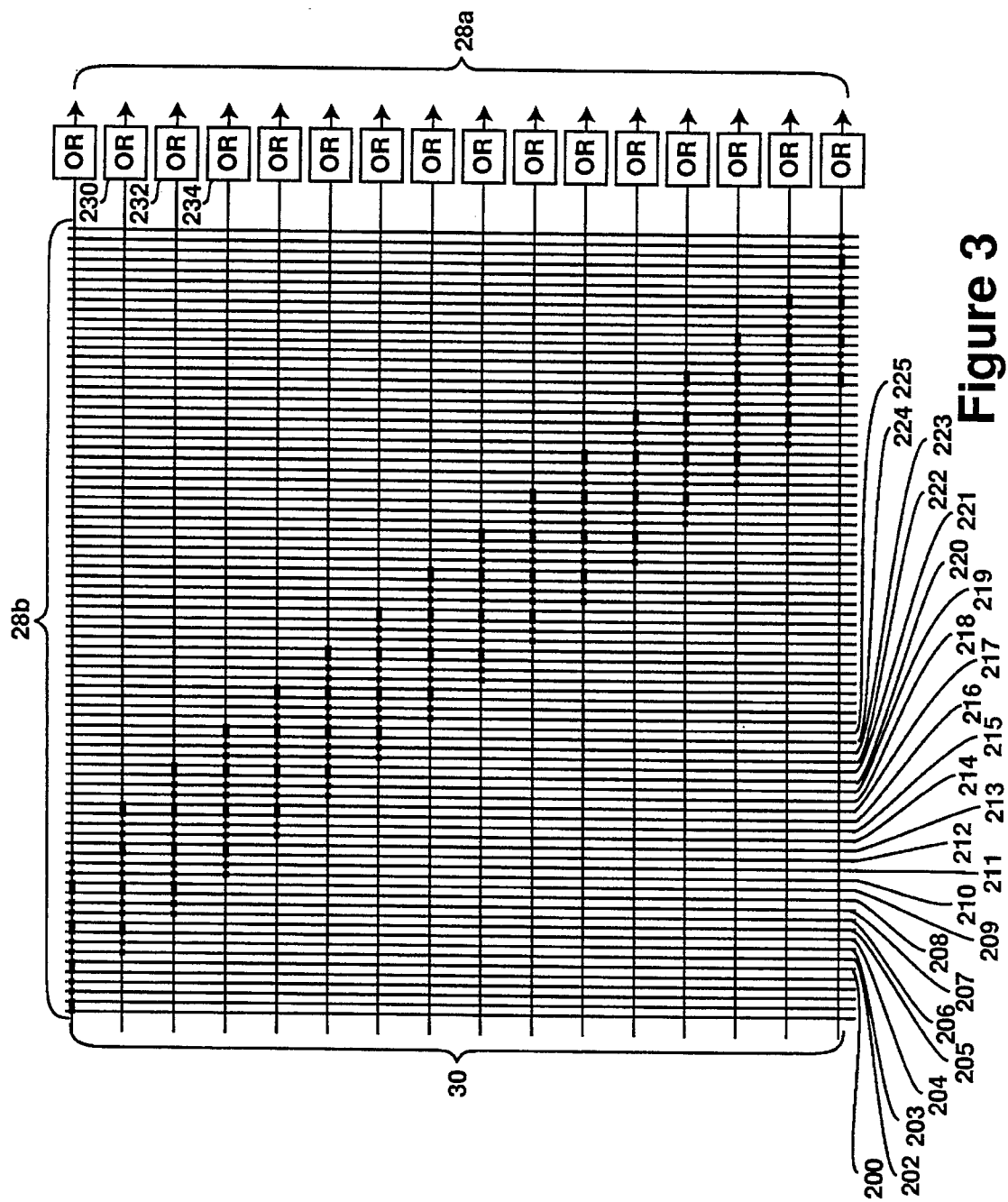
FIG. 3 is a block diagram of one embodiment of an OR array.

FIG. 3 illustrates an embodiment 24b of OR array 24 that distributes eighty product term signals 28b to sixteen OR devices 29. As with FIG. 2, all inputs to an OR device 29 are represented by a single line of input lines 30. Programmable elements are represented by dots intersecting input lines 30 and product term signal lines 28b. Groups of twelve programmable memory cells 30 distribute sixteen product term signals 28b to each OR device 29. Using fewer programmable elements than product term signals distributed to an OR device decreases the size of OR array 24b. Nonetheless, OR array 24b still permits product term steering with a granularity of one by distributing a subset of product term signals individually; i.e., one product term signal per programmable element.

OR array 24b variably distributes product term signals 28b to OR devices 29. Variable distribution of product term signals means that product term signals are not allocated to each OR device in the same manner. It also means that not all product term signals are distributed to a single OR device. For example, a majority of product term signals 28b, fifty of eighty total product term signals, are distributed to four OR devices. Another subset of product term signals are distributed to three OR devices; eight of eighty total product term signals. Another subset of the total product term signals 28b, eight, are coupled to only two OR devices. Finally, another subset of the total number of product term signals 28b, twelve, are distributed to only one OR device. These product term signals cannot be steered to, or shared with, any other OR device.

Variable distribution of product term signals provides sufficient commonality of product term signals between adjacent OR devices to allow product term signal sharing without wasting product term signal resources. The concept of sufficient commonality can be illustrated by example. Consider the distribution of product term signals 200–225 to OR devices 230, 232 and 234. OR device 232 can share product term signals with OR devices 232 and 234, but need not share the same product term signals with both OR devices 230 and 234. Product term signals 206–21 7 are distributed to both OR devices 230 and 232. In contrast, product term signals 210–221 are distributed to OR devices 232 and 234. Thus, OR device 232 can share some product term signals, 206–209, with OR device 230 without sharing them with OR device 234. Similarly, product term signals 218–221 can be shared between OR devices 232 and 234 without sharing the same signals with OR device 230. Thus, it will be understood that variable distribution of product term signals means that no two OR devices receive exactly the same set of product term signals.

It will be obvious to one of ordinary skill in the art that other variable distributions of product term signals to OR devices are possible.

Variable distribution of product term signals increases the effective density of PLD 20 without increasing its die size. That is to say, variable distribution increases the ratio of used product term signals to total product term signals as compared to OR arrays not using variable distribution. Variable distribution of product terms signals also allows both product term signal sharing and product term signal steering, as discussed above with respect to FIG. 2, without incurring any speed penalty.

Thus, an OR array has been described that variably distributes product term signals to OR devices. As a result, the OR array offers the flexibility of product term signal sharing and steering while incurring negligible speed penalties.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An OR array in a programmable logic device comprising:

a) a first programmable element coupled to a first product term signal;

b) a second programmable element coupled to a second product term signal and to a third product term signal;

c) a third programmable element coupled to the second product term signal and the third product term signal and;

d) a fourth programmable element coupled to a fourth product term signal;

e) a first OR device having inputs coupled to the first programmable element and the second programmable element; and f) a second OR device having inputs coupled to the third programmable element and the fourth programmable element.

2. An OR array in a programmable logic device comprising:

a) a first programmable element coupled to a first product term signal and a second product term signal;

b) a second programmable element coupled to a third product term signal;

c) a third programmable element coupled to a fourth product term;

d) a fourth programmable element coupled to a fifth product term signal and a sixth product term signal;

e) a fifth programmable element coupled to a seventh product term signal;

f) a sixth programmable element coupled to an eighth product term signal;

g) a seventh programmable element coupled to a ninth product term signal and a tenth product term signal;

h) an eighth programmable element coupled to an eleventh product term signal;

i) a ninth programmable element coupled to a twelfth product term signal;

j) a tenth programmable element coupled to a thirteenth product term signal and a fourteenth product term signal;

k) an eleventh programmable element coupled to a fifteenth product term signal;

l) a twelfth programmable element coupled to a sixteenth product term signal;

m) a first OR device having inputs coupled to the first programmable element, the second programmable element, the third programmable element, the fourth programmable element, the fifth programmable element, the sixth programmable element, the seventh programmable element, the eighth programmable element, the ninth programmable element, the tenth programmable element, the eleventh programmable element and the twelfth programmable element;

n) a thirteenth programmable element coupled to the ninth product term signal and the tenth product term signal;

o) a fourteenth programmable element coupled to the eleventh product term signal;

p) a fifteenth programmable element coupled to the twelfth product term signal;

q) a sixteenth programmable element coupled to the thirteenth product term signal and the fourteenth product term signal;

r) a seventeenth programmable element coupled the fifteenth product term signal;

s) an eighteenth programmable element coupled to the sixteenth product term signal;

t) a nineteenth programmable element coupled to a seventeenth product term signal from a seventeenth product term and an eighteenth product term signal;

u) a twentieth programmable element coupled a nineteenth product term signal;

v) a twenty-first programmable element coupled to a twentieth product term signal;

w) a twenty-second programmable element coupled to a twenty-first product term signal and a twenty-second product term signal;

x) a twenty-third programmable element coupled a twenty-third product term;

y) a twenty-fourth programmable element coupled to a twenty-fourth product term signal; and z) a second OR device having inputs coupled to the thirteenth programmable element, the fourteenth programmable element, the fifteenth programmable element, the sixteenth programmable element, the seventeenth programmable element, the eighteenth programmable element, the nineteenth programmable element, the twentieth programmable element, the twenty-first programmable element, the twenty-second programmable element, the twenty-third programmable element and the twenty-fourth programmable element.

3. An OR array within a programmable logic device including a first multiplicity of product term signals, the OR array comprising:

a second multiplicity of OR devices, the second multiplicity of OR devices being less than the first multiplicity of product term signals, a third multiplicity of product term signals being distributed to each of the second multiplicity of OR devices, the third multiplicity being less than the first multiplicity, a first subset of the first multiplicity of product term signals being distributed to a first number of OR devices, the first number of OR devices being less than the second multiplicity of OR devices, a second subset of the first multiplicity of product term signals being distributed to a second number of OR devices, the second number of OR devices being less than the first number of OR devices, and a third subset of the first multiplicity of product term signals being distributed to a third number of OR devices, the third number of OR devices being less than the second number of OR devices.

4. The OR array of claim 3 further comprising:

b) a fourth multiplicity of programmable elements, each of the fourth multiplicity of programmable elements being coupled between one product term signal and one OR device.

5. The OR array of claim 4 further comprising:

c) a fifth multiplicity of programmable elements, each of the fifth multiplicity of programmable elements being coupled between two product term signals and one OR device.

6. The OR array of claim 3 wherein the third multiplicity of product term signals is distributed to each OR device via a sixth multiplicity of programmable elements, the sixth multiplicity of programmable elements being less than the third multiplicity of product term signals.

7. The OR array of claim 3 wherein the first multiplicity of product term signals is within a range of 24 to 80.

8. The OR array of claim 3 wherein the second multiplicity of OR devices is within a range of 2 to 16.

9. The OR array of claim 3 wherein the third multiplicity of product term signals is 16.

10. The OR array of claim 5 wherein the first subset of the first multiplicity of product term signals equals 50.

11. The OR array of claim 3 wherein the second subset of the first multiplicity of product term signals equals 8.

12. The OR array of claim 7 wherein the first multiplicity of product term signals equals 80.

13. The OR array of claim 12 wherein the first subset of the first multiplicity of product term signals equals 50.

14. The OR array of claim 13 wherein the second subset of the first multiplicity of product term signals equals 8.

15. The OR array of claim 14 wherein a third subset of the first multiplicity of product term signals terms signals is distributed to a third number of OR devices, the third number of OR devices being less than the second number of OR devices.

16. The OR array of claim 3 wherein a fourth subset of the first multiplicity of product term signals is distributed to a fourth number of OR devices, the fourth number of OR devices being less than the third number of OR devices.

17. The OR array of claim 15 wherein the third subset of the first multiplicity of product term signals equals 8.

18. The OR array of claim 17 wherein a fourth subset of the first multiplicity of product term signals is distributed to a fourth number of OR devices, the fourth number of OR devices being less than the third number of OR devices.

19. A programmable logic device comprising:

an AND array having a plurality of outputs for outputting a plurality of product term signals;

an OR array comprising a plurality of OR devices, each OR device having a plurality of inputs for receiving less than all of the plurality of product term signals; and a plurality of programmable elements for selectively steering product term signals to the OR array, the plurality of programmable elements being coupled between the outputs of the AND array and the inputs of the OR array such that a first subset of the plurality of product term signals are distributed to a first number of the plurality of OR devices, a second subset of the product term signals are distributed to a second number of the plurality of OR devices, wherein the second number is less than the first number, a third subset of the product term signals is distributed to a third number of the plurality of OR devices, wherein the third number is less than the second number, and a fourth subset of product term signals is distributed to a fourth number of the plurality of OR devices, wherein the fourth number is less than the third number.

20. A programmable logic device comprising:

an AND array having a plurality of outputs for outputting a plurality of product term signals;

an OR array comprising a plurality of OR devices, each OR device having a plurality of inputs for receiving less than all of the plurality of product term signals; and a plurality of programmable elements for selectively steering product term signals to the OR array, the plurality of programmable elements being coupled between the outputs of the AND array and the inputs of the OR array such that a first subset of the plurality of product term signals are distributed to a first number of the plurality of OR devices, a second subset of the product term signals are distributed to a second number of the plurality of OR devices, wherein the second number is less than the first number, a third subset of the product term signals is distributed to a third number of the plurality of OR devices, wherein the third number is less than the second number, and a fourth subset of product term signals is distributed to a fourth number of the plurality of OR devices, wherein the fourth number is less than the third number, wherein the plurality of programmable elements comprises:

a first set of programmable elements each operative to steer a single product term to a single input of the OR array; and a second set of programmable elements each operative to steer a plurality of product terms to a single input of the OR array.

21. The OR array of claim 3 wherein the third subset of the first multiplicity of product term signals equals 8.

22. The OR array of claim 16 wherein the fourth subset of the first multiplicity of product term signals equals 12.

23. The OR array of claim 18 wherein the fourth subset of the first multiplicity of product term signals equals 12.

24. In a programmable logic device, a circuit comprising:

a plurality of input lines;

a plurality of output lines;

a plurality of programmable elements coupled between the input lines and the output lines for selectively coupling the inputs lines to the output lines, the input lines being coupled to the plurality of programmable elements such that a first subset of the plurality of input lines is coupled to a first number of programmable elements, a second subset of the plurality of input lines is coupled to a second number of programmable elements, wherein the second number is less than the first number, and a third subset of the plurality of input lines is coupled to a third number of programmable elements, wherein the third number is less than the second number.

\* \* \* \* \*